US007964430B2

(12) United States Patent
Won et al.

(10) Patent No.: US 7,964,430 B2
(45) Date of Patent: Jun. 21, 2011

(54) SILICON LAYER ON A LASER TRANSPARENT CONDUCTIVE OXIDE LAYER SUITABLE FOR USE IN SOLAR CELL APPLICATIONS

(75) Inventors: Tae Kyung Won, San Jose, CA (US); Soo Young Choi, Fremont, CA (US); Yong Kee Chae, Pleasanton, CA (US); Liwei Li, Sunnyvale, CA (US); Shuran Sheng, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 785 days.

(21) Appl. No.: 11/752,823

(22) Filed: May 23, 2007

(65) Prior Publication Data

US 2008/0289687 A1 Nov. 27, 2008

(51) Int. Cl.
*H01L 21/332* (2006.01)
*H01L 21/00* (2006.01)

(52) U.S. Cl. .......... 438/58; 438/473; 438/796; 438/940; 257/E21.475

(58) Field of Classification Search .................... 438/58, 438/473, 796, 940; 257/E21.475
See application file for complete search history.

(56) References Cited

U.S. PATENT DOCUMENTS

| | | | | |
|---|---|---|---|---|
| 4,792,378 | A | 12/1988 | Rose et al. | |
| 5,296,674 | A | 3/1994 | Praschek et al. | |
| 5,593,901 | A * | 1/1997 | Oswald et al. | 438/80 |
| 6,024,799 | A | 2/2000 | Chen et al. | |
| 6,060,506 | A | 5/2000 | Catt et al. | |
| 6,063,203 | A | 5/2000 | Satoh et al. | |
| 6,113,700 | A | 9/2000 | Choi et al. | |
| 6,849,560 | B2 | 2/2005 | Suezaki et al. | |
| 2002/0174885 | A1 * | 11/2002 | Sun et al. | 134/100.1 |
| 2003/0209323 | A1 | 11/2003 | Yokogaki | |
| 2004/0221959 | A1 | 11/2004 | Choi et al. | |
| 2005/0251990 | A1 | 11/2005 | Choi et al. | |
| 2005/0255257 | A1 | 11/2005 | Choi et al. | |
| 2006/0032586 | A1 * | 2/2006 | Choi et al. | 156/345.51 |
| 2006/0185795 | A1 | 8/2006 | Choi et al. | |

(Continued)

FOREIGN PATENT DOCUMENTS

CN 1866546 A 11/2006

(Continued)

OTHER PUBLICATIONS

Official letter dated May 20, 2009 from Korean Patent Office for corresponding Korean Patent Application No. 10-2007-0106053.
Official letter dated May 15, 2009 from Chinese Patent Office for corresponding Chinese Patent Application No. 2007101653382. Also provided is a concise statement of relevance for CN1866546A.

(Continued)

*Primary Examiner* — Hsien-ming Lee
*Assistant Examiner* — Kevin Parendo
(74) *Attorney, Agent, or Firm* — Patterson & Sheridan, L.L.P.

(57) ABSTRACT

Methods and apparatus for reducing defects on transparent conducting oxide (TCO) layer are provided. In one embodiment, a method for depositing a silicon layer on a transparent conducting oxide (TCO) layer may include providing a substrate having a TCO layer disposed thereon, wherein the TCO layer has a peripheral region and a cell integrated region, the cell integrated region having laser scribing patterns disposed thereon, positioning the substrate on a substrate support assembly disposed in a processing chamber, wherein the substrate support assembly has a roughened surface in contact with the substrate, contacting a shadow frame to the peripheral region of the TCO layer and to the substrate support assembly thereby creating an electrical ground path between the TCO layer and substrate support through the shadow frame, and depositing a silicon containing layer on the TCO layer through an aperture of the shadow frame.

16 Claims, 6 Drawing Sheets

U.S. PATENT DOCUMENTS

| | | | |
|---|---|---|---|
| 2006/0236934 | A1 | 10/2006 | Choi et al. |
| 2007/0012663 | A1 | 1/2007 | Hosokawa et al. |
| 2007/0178810 | A1 | 8/2007 | Choi et al. |
| 2008/0131622 | A1 | 6/2008 | White et al. |

FOREIGN PATENT DOCUMENTS

| | | | |
|---|---|---|---|
| EP | 1746181 | A2 | 1/2007 |
| JP | 2001007087 | A | 1/2001 |
| JP | 2002-076402 | | 3/2002 |

* cited by examiner

SILICON LAYER ON A LASER TRANSPARENT CONDUCTIVE OXIDE LAYER SUITABLE FOR USE IN SOLAR CELL APPLICATIONS

This application is related to U.S. patent application Ser. No. 11/752,794, filed May 23, 2007, entitled METHODS FOR DEPOSITING A SILICON LAYER ON A LASER SCRIBED TRANSPARENT CONDUCTIVE OXIDE LAYER SUITABLE FOR USE IN SOLAR CELL APPLICATIONS by Tae Kyung Won, et al., which is incorporated by reference in its entirety.

BACKGROUND OF THE DISCLOSURE

1. Field of the Invention

The present invention relates to methods and apparatus for depositing a silicon layer on a transparent conducting oxide (TCO) layer suitable for fabricating photovoltaic devices.

2. Description of the Background Art

Photovoltaic (PV) devices or solar cells are devices which convert sunlight into direct current (DC) electrical power. PV or solar cells typically have one or more p-i-n junctions. Each junction comprises two different regions within a semiconductor material where one side is denoted as the p-type region and the other as the n-type region. When the p-i-n junction of the PV cell is exposed to sunlight (consisting of energy from photons), the sunlight is directly converted to electricity through a PV effect. PV solar cells generate a specific amount of electric power and cells are tiled into modules sized to deliver the desired amount of system power. PV modules are created by connecting a number of PV solar cells and are then joined into panels with specific frames and connectors.

Typically, a PV solar cell includes a photoelectric conversion unit and a transparent conductive oxide (TCO) film. The transparent conductive oxide (TCO) film is disposed as a front electrode on the bottom of the PV solar cell in contact with a glass substrate and/or as a back surface electrode on the top of the PV solar cell. The transparent conductive oxide (TCO) layer is a conductive layer that provides high electricity collection and photoelectric conversion efficiency for the solar cells. The photoelectric conversion unit includes a p-type silicon layer, a n-type silicon layer and an intrinsic type (i-type) silicon layer sandwiched between the p-type and n-type silicon layers. Several types of silicon films including microcrystalline silicon film (μc-Si), amorphous silicon film (a-Si), polycrystalline silicon film (poly-Si) and the like may be utilized to form the p-type, n-type and i-type layers of the photoelectric conversion unit. Typically, the silicon films of the photoelectric conversion unit are deposited by a plasma enhanced chemical vapor deposition (PECVD) process. One problem with the formation of current thin film solar cells is that haze, discolor, or other similar types of defects may form on the TCO layer during deposition of materials thereover.

Therefore, there is a need for an improved method and apparatus for depositing silicon layer on a TCO layer.

SUMMARY OF THE INVENTION

The present invention provides a method and apparatus for depositing a silicon layer on a transparent conducting oxide (TCO) layer. In one embodiment, a method for depositing a silicon layer on a transparent conducting oxide (TCO) layer may include providing a substrate having a TCO layer disposed thereon, wherein the TCO layer has a peripheral region and a cell integrated region, the cell integrated region having laser scribing patterns disposed thereon, positioning the substrate on a substrate support assembly disposed in a processing chamber, wherein the substrate support assembly has a roughened surface in contact with the substrate, contacting a shadow frame to the peripheral region of the TCO layer and to the substrate support assembly thereby creating an electrical ground path between the TCO layer and substrate support through the shadow frame, and depositing a silicon containing layer on the TCO layer through an aperture of the shadow frame.

In another embodiment, a method for depositing a silicon layer on a transmitting conducting oxide (TCO) layer may include providing a substrate having a TCO layer disposed thereon, wherein the TCO layer has a peripheral region and a cell integrated region, the cell integrated region having laser scribing patterns disposed thereon, positioning the substrate on a substrate support assembly disposed in a processing chamber, wherein the substrate support assembly has a roughened surface in contact with the substrate, contacting a shadow frame to the peripheral region of the TCO layer and to the substrate support assembly thereby creating an electrical ground path between the TCO layer and substrate support through the shadow frame, and depositing a silicon containing layer on the TCO layer through an aperture of the shadow frame.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

Figure 1:
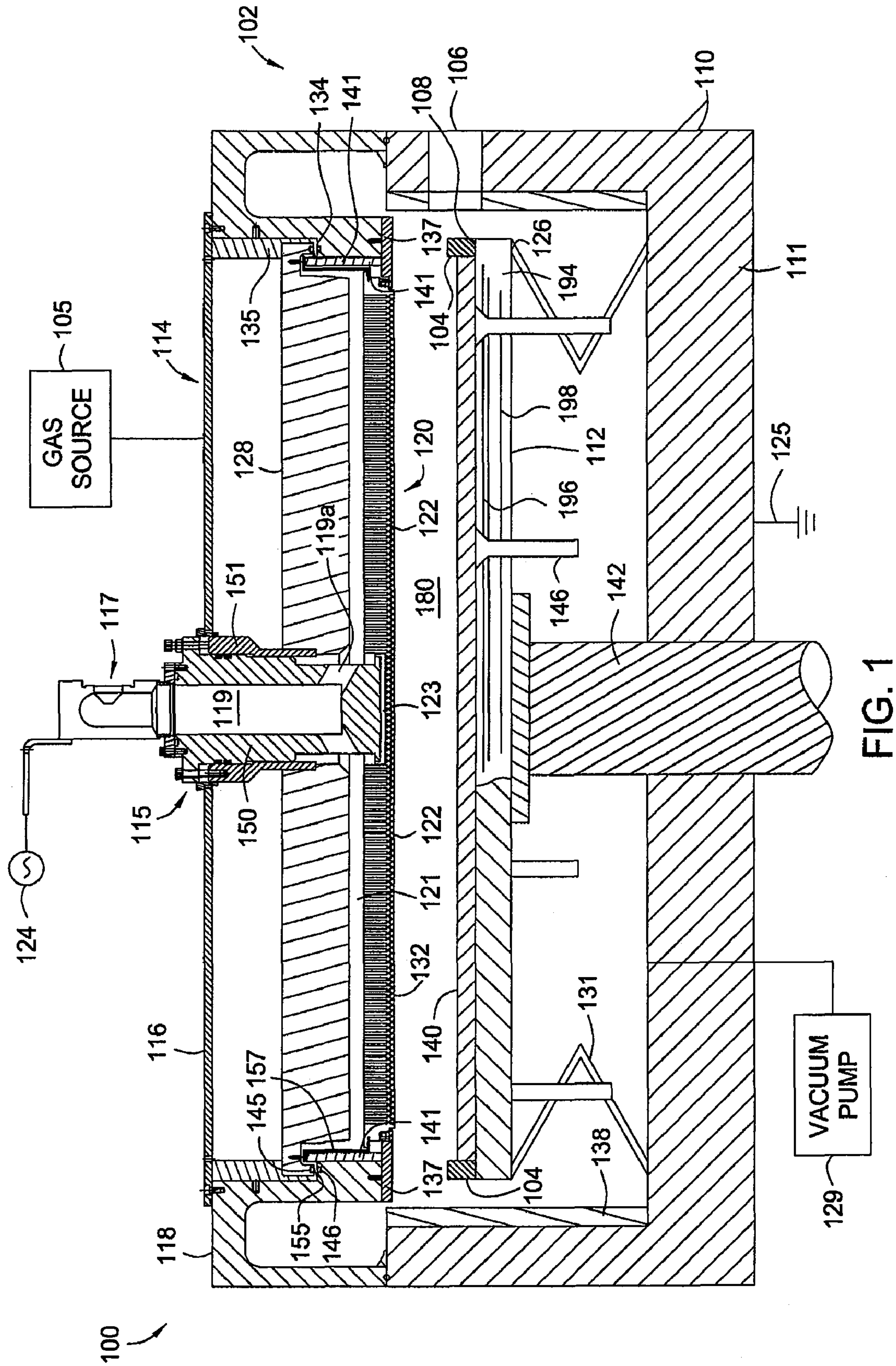
FIG. 1 depicts a schematic cross-sectional view of one embodiment of a process chamber in accordance with the invention.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention provide methods and apparatus for depositing a silicon layer on a transmitting conducting oxide (TCO) layer suitable for solar cell applications, among others. In one embodiment, potential defects, such as blackish discoloring, haze, and arcing, may be reduced by releasing charges accumulated on the TCO surface by a well grounded depositing environment. Some embodiments for providing a well grounded depositing environment include an improved surface design pattern on the TCO layer, a roughened substrate support assembly and/or an improved shadow frame which is utilized to provide good electrical ground during silicon deposition.

Embodiments of the present invention provide methods and apparatus for depositing a silicon layer on a transparent conducting oxide (TCO) layer suitable for solar cell applications, among others. In one embodiment, potential defects, such as blackish discoloring, haze, and arcing, may be reduced by releasing charges accumulated on the TCO surface by a well grounded depositing environment. Some embodiments for providing a well grounded depositing environment include an improved surface design pattern on the TCO layer, a roughened substrate support assembly and/or an improved shadow frame which is utilized to provide good electrical ground during silicon deposition.

The system 100 generally includes a processing chamber body 102 having walls 110 and a bottom 111 that partially define a process volume 180. The process volume 180 is typically accessed through a port and/or a valve 106 to facilitate movement of a substrate 140, such as a glass substrate, stainless steel substrate, or plastic substrate, semiconductor substrate, or other suitable substrate, into and out of the processing chamber body 102. The chamber 100 supports a lid assembly 118 surrounding a gas inlet manifold 114 that consists of a cover plate 116, a first plate 128 and a second plate 120. In one embodiment, the first plate 128 is a backing plate, and the second plate 120 is a gas distribution plate, for example, a diffuser. A vacuum pump 129 is disposed on the bottom of the chamber body 102 to maintain the chamber 100 within a desired pressure range. Optionally, the walls 110 of the chamber 102 may be protected by covering with a liner 138, such as a ceramic material, anodizing or other protective coating to prevent damage during processing.

The diffuser 120 has a plurality of orifices 122 formed therethrough that allows a process gas or gasses from a gas source 105 into to the chamber body 102. The diffuser 120 is positioned above the substrate 140 and may be suspended below the lid assembly 118 by a diffuser gravitational support 115. In one embodiment, the diffuser 120 is supported from an upper lip 155 of the lid assembly 118 by a flexible suspension 157. One suitable flexible suspension 157 is disclosed in detail by U.S. Pat. No. 6,477,980, issued Nov. 12, 2002, titled "Flexibly Suspended Gas Distribution Manifold for A Plasma Chamber", and is herein incorporated by reference. The flexible suspension 157 is adapted to support the diffuser 120 from its edges to allow expansion and contraction of the diffuser 120.

In one embodiment, the flexible suspension 157 may have different configurations utilized to facilitate the expansion and contraction of the diffuser 120. In another embodiment, the flexible suspension 157 may be used with the diffuser gravitational support 115 to control the curvature of the diffuser 120. For example, the diffuser 120 may have a concave, planar or convex surface. One suitable diffuser 120 is disclosed in detail by U.S. Patent Publication No. 2006/0,060,138, filed Sep. 20, 2004 by Keller et al, titled "Diffuser Gravity Support", and is herein incorporated by reference.

The spacing between the diffuser surface 132 and the substrate surface, as shown in FIG. 1, is selected and adjusted to enable the deposition process to be optimized over a wide range of deposition conditions, while maintaining uniformity of film deposition. In one embodiment, the spacing is set to about 100 mils or larger, such as between about 400 mils to about 1600 mils, such as between about 400 mils and about 1200 mils during processing.

The diffuser gravitational support 115 may supply a process gas to a gas block 117 mounted on the support 115. The gas block 117 is in communication with the diffuser 120 via a longitudinal bore 119 formed through the support 115, and supplies a process gas to the plurality of orifices 122 within the diffuser 120. In one embodiment, one or more process gasses travel through the gas block 117, and exit the longitudinal bore 119 through angled bores 119*a* into a large plenum 121 created between backing plate 128 and diffuser 120, and a small plenum 123 within the diffuser 120. Subsequently, the one or more process gasses travel from the large plenum 121 and the small plenum 123 through the plurality of orifices 122 formed through the diffuser 120 and into the processing volume 180 below the diffuser 120. In operation, the substrate 140 is raised to the processing volume 180 and the plasma generated from a plasma source 124 excites gas or gases to deposit films on the substrate 140.

The diffuser gravitational support 115 may supply a process gas to a gas block 117 mounted on the support 115. The gas block 117 is in communication with the diffuser 120 via a longitudinal bore 119 formed through the support 115, and supplies a process gas to the plurality of orifices 122 within the diffuser 120. In one embodiment, one or more process gasses travel through the gas block 117, and exit the longitudinal bore 119 through angled bores 119*a* into a large plenum 121 created between first plate 128 and diffuser 120, and a small plenum 123 within the diffuser 120. Subsequently, the one or more process gasses travel from the large plenum 121 and the small plenum 123 through the plurality of orifices 122 formed through the diffuser 120 and into the processing volume 180 below the diffuser 120. In operation, the substrate 140 is raised to the processing volume 180 and the plasma generated from a plasma source 124 excites gas or gases to deposit films on the substrate 140.

A substrate support assembly 112 is generally disposed on the bottom of the chamber body 102. The support assembly 112 is grounded such that RF power, supplied by the plasma source 124, supplied to the diffuser 120 may excite gases, source compounds, and/or precursors present in the process volume 180 as stated above. The RF power from the plasma source 124 is generally selected commensurate with the size of the substrate 140 to drive the chemical vapor deposition process.

In one embodiment, a RF power is applied to the diffuser 120 to generate an electric field in the process volume 180. For example, a power density of about 100 mWatts/cm$^2$ or greater during film depositing. The plasma source 124 and matching network (not shown) create and/or sustain a plasma of the process gases in the process volume 180. Various frequencies of the RF and VHF power may be used to deposit the silicon film. In one embodiment, a RF and VHF power at a range between about 0.3 MHz and about 200 MHz, such as about 13.56 MHz, or about 40 MHz, may be used. In another embodiment, a RF power of about 13.56 MHz and a low frequency RF power of about 350 KHz may be used. In yet another embodiment, a VHF power of about 27 MHz up to about 200 MHz may be utilized to deposit films with high deposition rate.

The substrate support assembly 112 has a lower side 126 and an upper side 108 adapted to support the substrate 140. A stem 142 is coupled to the lower side 126 of the substrate support assembly 112 and a lift system (not shown) for moving the support assembly 112 between an elevated processing position and a lowered substrate transfer position. The stem 142 provides a conduit for coupling electrical, thermocouple leads and other utilities to the substrate support assembly 112. The substrate support assembly 112 may also include grounding straps 131 to provide RF grounding around the periphery of the substrate support assembly 112. Examples of grounding straps are disclosed in U.S. Pat. No. 6,024,044 issued on Feb. 15, 2000 to Law et al. and U.S. patent application Ser. No. 11/613,934 filed on Dec. 20, 2006 to Park et al., which are both incorporated by reference in their entirety.

The substrate support assembly 112 includes a conductive body 194 having the upper side 108 for supporting the substrate 140 thereon. The conductive body 194 may be made of a metal or metal alloy. In one embodiment, the conductive body 194 is made of aluminum. Lift pins 146 are moveably disposed through the substrate support assembly 112 and are adapted to space the substrate 140 from the substrate receiving surface 108. Alternatively, the outer surface of the conductive body 194 may be coated and/or anodized by a dielectric layer to prevent the substrate support assembly 112 from chemical attack during processing.

The substrate support assembly 112 includes a conductive body 194 having the upper side 108 for supporting the substrate 140 thereon. The conductive body 194 may be made of a metal or metal alloy. In one embodiment, the conductive body 194 is made of aluminum. Lift pins 146 are moveably disposed through the substrate support assembly 112 and are adapted to space the substrate 140 from the substrate receiving surface defined by the upper side 108 of the conductive body 194. Alternatively, the outer surface of the conductive body 194 may be coated and/or anodized by a dielectric layer to prevent the substrate support assembly 112 from chemical attack during processing.

The temperature of the substrate support assembly 112 is controlled to maintain the substrate within a predetermined temperature range during substrate processing. In one embodiment, the substrate support assembly 112 includes one or more electrodes and/or heating elements 198 utilized to control the temperature of the substrate support assembly 112 during processing. The heating elements 198 controllably heat the substrate support assembly 112 and the substrate 140 positioned thereon to a determined temperature range, e.g., a set point temperature of about 100 degrees Celsius or higher. In an exemplary embodiment, the heating elements 198 may include an inner heating element embedded in the center portion of the substrate support assembly 112 and an outer heating element embedded in the edge portion of the substrate support assembly 112. As the outer edge of the substrate 140 may have a temperature lower than the center portion of the substrate 140 due to thermal contributions from the plasma distribution, the outer heating element may be configured to maintain a temperature slightly higher than the temperature of the inner heating element, such as higher than about 20 degrees Celsius, thereby maintaining the uniform temperature across the substrate 140. It is contemplated that the temperature configuration of the inner and outer heating element may be varied based on process requirements.

In another embodiment, the substrate support assembly 112 may further include one or more cooling channels 196 embedded within the conductive body 194. The one or more cooling channels 196 are configured to maintain the temperature variation in the processing volume 180 within a predetermined temperature range during processing, such as a temperature of variation less than about 20 degrees Celsius. The cooling channels 196 may be fabricated from metals or metal alloys which provide desired thermal conductivity. In one embodiment, the cooling channels 196 are made of a stainless steel material.

In one embodiment, the temperature of the substrate support assembly 112 that includes the heating elements 198 and cooling channels 196 embedded therein is configured to allow substrates with low melt point, such as alkaline glasses, plastic and metal, to be processed using embodiments of the present invention. In another embodiment, the heating elements 198 and the cooling channels 196 may maintain a temperature about 100 degrees Celsius or higher, such as between about 150 degrees Celsius to about 550 degrees Celsius.

The substrate support assembly 112 additionally supports a circumscribing shadow frame 104. The shadow frame 104 prevents deposition at edge of the substrate 140 and the substrate support assembly 112 so that the substrate 140 does not stick to the substrate support assembly 112 after processing. The shadow frame 104 is generally supported from a supported from an inner wall of the chamber body 102 when the substrate support assembly 112 is in a lower non-processing position (not shown). The shadow frame 104 is engaged and aligned to the conductive body 194 of the substrate support assembly 112 as the substrate support assembly 112 is moved to an upper processing position for the deposition process. In one embodiment, the shadow frame 104 may be fabricated by a conductive material that provides a good conductive interface for grounding while engaging with the substrate 140. The shadow frame 104 may be fabricated from aluminum, aluminum alloy or other suitable material.

Figure 2A:
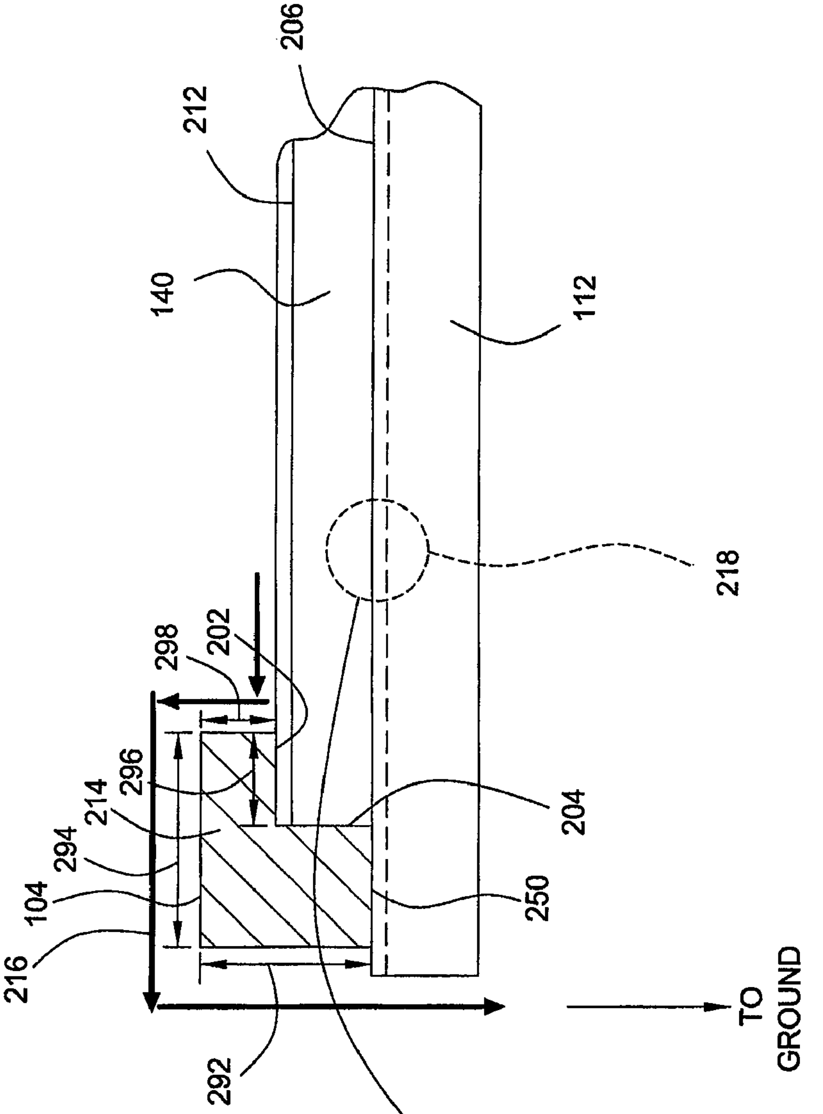
FIG. 2A depicts an enlarged sectional view of an edge of the shadow frame disposed on the substrate support of FIG. 1.

FIG. 2A depicts an enlarged partial sectional view of the shadow frame 104 disposed on an edge of the substrate support assembly 112. In the embodiment depicted in FIG. 2A, a conductive TCO layer 212 is deposited on the surface of the substrate 140. After the substrate 140 is transferred into the PECVD system 100, the shadow frame 104 is positioned over the edge of the substrate 140 prior to processing. The body of the shadow frame 104 has a lower inner wall 204 circumscribing the substrate edge which may be in contact with an outside edge of the substrate 140. The shadow frame body also has a lower bottom surface adapted to contact with a periphery region 250 of the substrate support assembly 112. The shadow frame 104 further has a lip 214 that extends inward over the top of the substrate. The lip 214 has a bottom surface 202 that is in contact with the conductive TCO layer 212 disposed on the substrate 140. In one embodiment, bottom surface 202 of the lip 214 is a conductive surface 202 vertically offset from the lower surface of the shadow frame body. In one embodiment, the lip 214 has a height 298 of about 2 millimeter (mm) and a length 296 of about 13 millimeter (mm) for holding a substrate having a dimension of 2200 millimeter×2600 millimeter. The shadow frame 104 may have a total length 294 of about 145 millimeter (mm) and a height of about 15 millimeter (mm). It is contemplated that the dimension of the shadow frame 104 and the lip 214 formed thereof may be varied to accommodate different substrates having different dimensions and materials.

In performing the plasma enhanced process for depositing silicon films on the TCO layer 212, the transparent conductive oxide (TCO) layer is exposed to plasma environment created in the PECVD system 100. The high power plasma from the silicon deposition process may generate charges on the surface of the TCO layer 212. As the charges continuously accumulate on the TCO surface, a well grounded substrate support assembly holding the TCO substrate during plasma process is desired in order to release the accumulated charge from the substrate surface. A poorly grounded processing environment may cause abnormal discharge and/or arcing on the conductive TCO substrate surface, thereby resulting in blackish discoloring, haze and other defects on the TCO layer. Serious blackish discoloring or haze on the TCO substrate surface may damage the TCO film properties, thereby adversely impacting electrical device performance and integration of the PV solar cell.

In the embodiment depicted in FIG. 2A, as the bottom surface 202 is in direct contact with the conductive TCO layer 212, the electrical conductivity of the shadow frame 104 facilitates the release of charge buildup between the TCO layer 212 and ground, as shown in arrow 216. In order to provide a well grounded surface for plasma depositing a silicon layer on the TCO layer 212, the shadow frame 104 may be fabricated by a conductive material that provides a good electrical path for releasing charges accumulated on the substrate surface. Furthermore, the bottom surface of the shadow frame body is a conductive surface adapted to contact the periphery region 250 of the substrate support assembly so as to provide a good electrical conductivity to release of charge buildup thereof. In one embodiment, the shadow frame 104 may be fabricated from aluminum, aluminum alloy, or other suitable conductive material. The bottom surface 202 may also have a contact surface with different configurations to provide a good contact interface with the substrate surface without adversely scratch and/or damage the substrate surface. For example, the bottom surface 202 may be in a form of a flat surface, a rounded tip, a notched surface, a concave or convex surface, an embossed surface, a grooved surface, a roughened surface and the like.

Figure 2B:
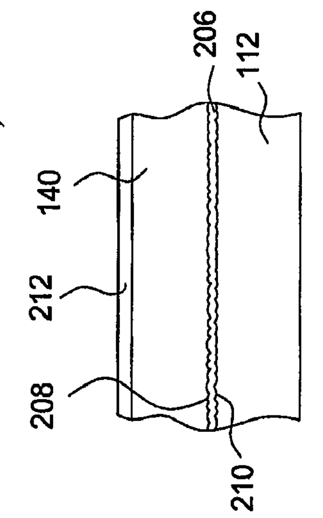
FIG. 2B depicts an enlarged sectional view of an interface between the substrate disposed on the substrate support of FIG. 1.

FIG. 2B depicts an enlarged view of an interface 218 of the upper surface of the substrate support assembly 112 and the substrate 140 of FIG. 2A. As previously described, the substrate support assembly 112 may have a roughened surface 210 that provides good electrical contact with the substrate 140, thereby facilitating the release of charges between the facing surfaces of the substrate 140 and the substrate support assembly surface 112 during plasma processing. In one embodiment, the roughened surface 210 may include about 90 percent or greater on the entire surface of upon which the substrate 140 is in contact the substrate support assembly surface. For example, the roughened surface 210 may include the entire surface directly below and supporting the substrate 140. Alternatively, the surface roughness may extend to the periphery area 250 where the shadow frame 104 is disposed, as shown in FIG. 2A. In a certain embodiment where the surface roughness does not extend to the periphery area 250, the surface roughness is formed entirely on the area directly below and in contact with the substrate 140. As such, the open area defined by an inner wall of lip 214 of the shadow frame 104 is smaller than the area of the surface roughness, which allows the shadow frame 104 to be disposed sandwich the substrate against the roughened area for improved contact.

The good electrical contact between the bottom surface 202 of the shadow frame 104 and the contact surface 250 may provide a good electrical contact for releasing charges. By well control of the predetermined location and/or percentage of where the surface roughness and the materials that is in contact with the substrate support assembly surface, the daze, discolor or other associated arcing issue on the conductive materials, such as the TCO layer 212, is thereby efficiently controlled and eliminated.

In embodiments where an anodized layer 206 is present on the substrate support assembly 112, the upper surface 208 of the anodized layer 206 may be roughed as well to obtain a desired surface roughness. In one embodiment, the anodized layer may be roughed on an entire area where the substrate is in contact with to provide a good electrical contact to the substrate 140. The anodized layer may have a thickness between about 0.1 micro-inch (μ-inch) and about 2 micro-inch (μ-inch). In one embodiment, the roughened surfaces 208, 210 may have a roughness ranging from about 100 micro-inch (μ-inch) and about 3000 micro-inch (μ-inch).

In one embodiment, the surface 210 of the substrate support assembly 112 may be roughed by bead blasting (BB) to a pre-determined surface finish. Bead blasting may include impacting the substrate support assembly 112 with a ceramic or oxide bead. In another embodiment, the bead is aluminum oxide having an average diameter of about 125 micrometer to about 375 micrometer. The beads are provided through a nozzle having an exit velocity sufficient to produce a surface finish of about 100 micro-inch (μ-inch) and about 3000 micro-inch (μ-inch). Alternatively, the substrate roughness may be achieved by abrasive blasting, grinding, texturing, embossing, sanding, etching or other suitable manner used in the art. In embodiments where the anodized layer 206 is desired, the substrate support surface 210 is anodized coated to form the anodized layer 206 on the substrate support surface 210. The anodized layer 206 is subsequently treated to provide a roughened surface finish. The treating process may include bead blasting, abrasive blasting, grinding, embossing, sanding, texturing, etching or other method for providing a pre-defined surface roughness. After the surface finish and/or treating process, a chemical graining process, such as Light Clean (LC), Enhanced Clean (EC), Ultrasonic Clean (UC), Chemical Clean (CC), or the like may be performed to clean the finished/treated surface. In one embodiment, Enhanced Clean (EC) used to treat/finish the surface typically refers to a solution mixture of $HNO_3$, NaOH, $H_3PO_4/H_2SO_4$. Chemical Clean (CC) refers to a procedure using a solution mixture of $HNO_3$, HF and DI water in contact with the surface to be treated for a short time period, such as about 30 seconds until a desired surface roughness has been reached. Details of the roughening process of the substrate support assembly surface are disclosed by U.S. Patent Publication No. 2006/0032586, which published Feb. 16, 2006 by Choi, entitled "Reducing Electrostatic Charge by Roughening The Susceptor" and U.S. patent application Ser. No. 11/498,606 which filed Aug. 2, 2006 by Choi, entitled "Particle Reduction on Surface of Chemical Vapor Deposition Processing Apparatus", which are herein incorporated by references.

As a stack of silicon films utilized to form p-i-n junctions are sequentially deposited on the conductive TCO layer in solar applications, the good electrical contact between the substrate 140 and the substrate support surface is important to prevent arcing and surface damage formed on the conductive TCO surface. By a well controlled roughness of the substrate surface, the conductive TCO layer where the silicon films deposited may have a good electrical contact to the substrate support surface, thereby providing a well grounded substrate support assembly to release charges from the deposition process.

Figure 3A:
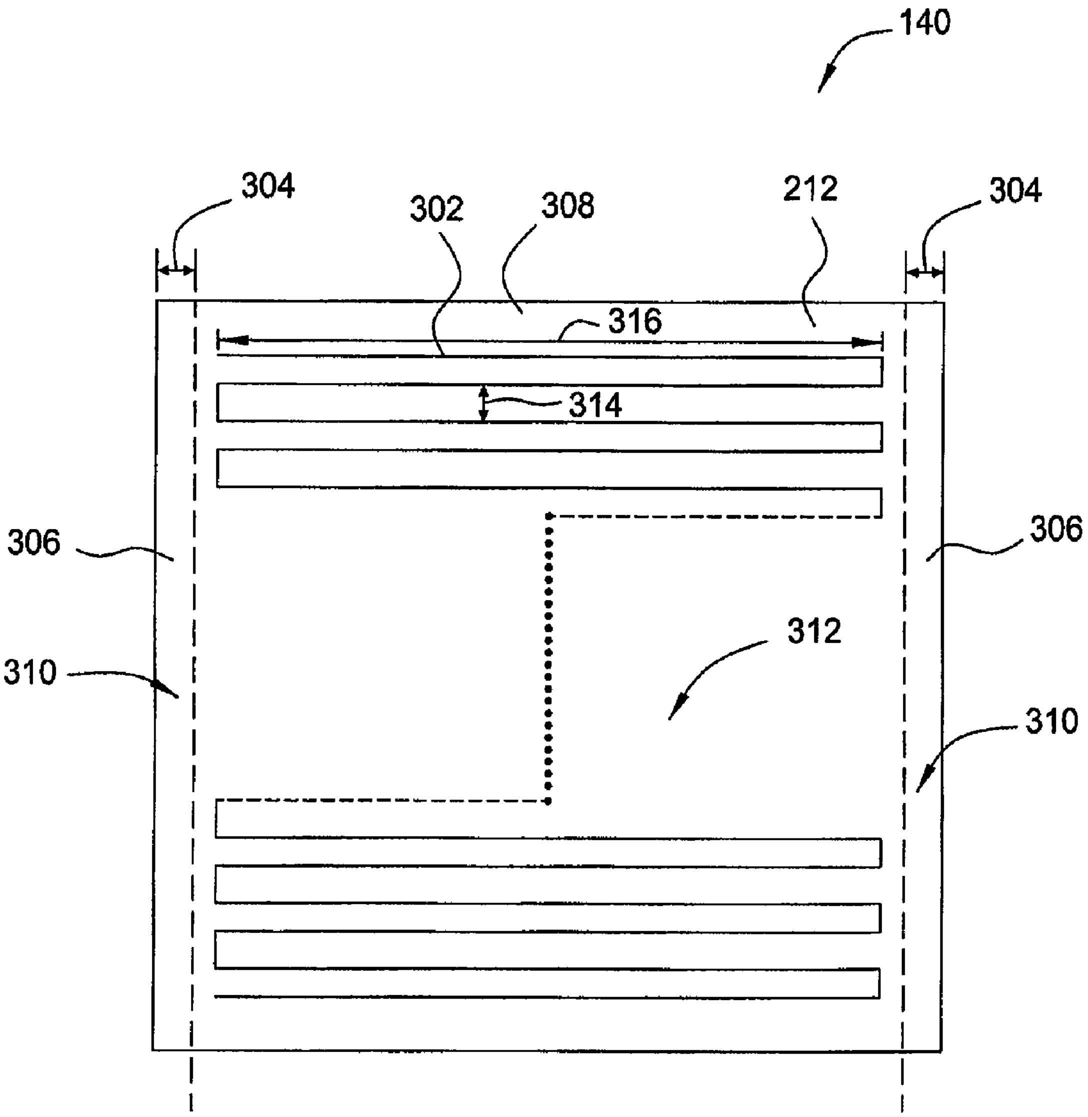
FIGS. 3A-C depict different embodiments of a top view of a laser scribed pattern design on a substrate surface having a TCO layer disposed thereon.
Figure 3B:
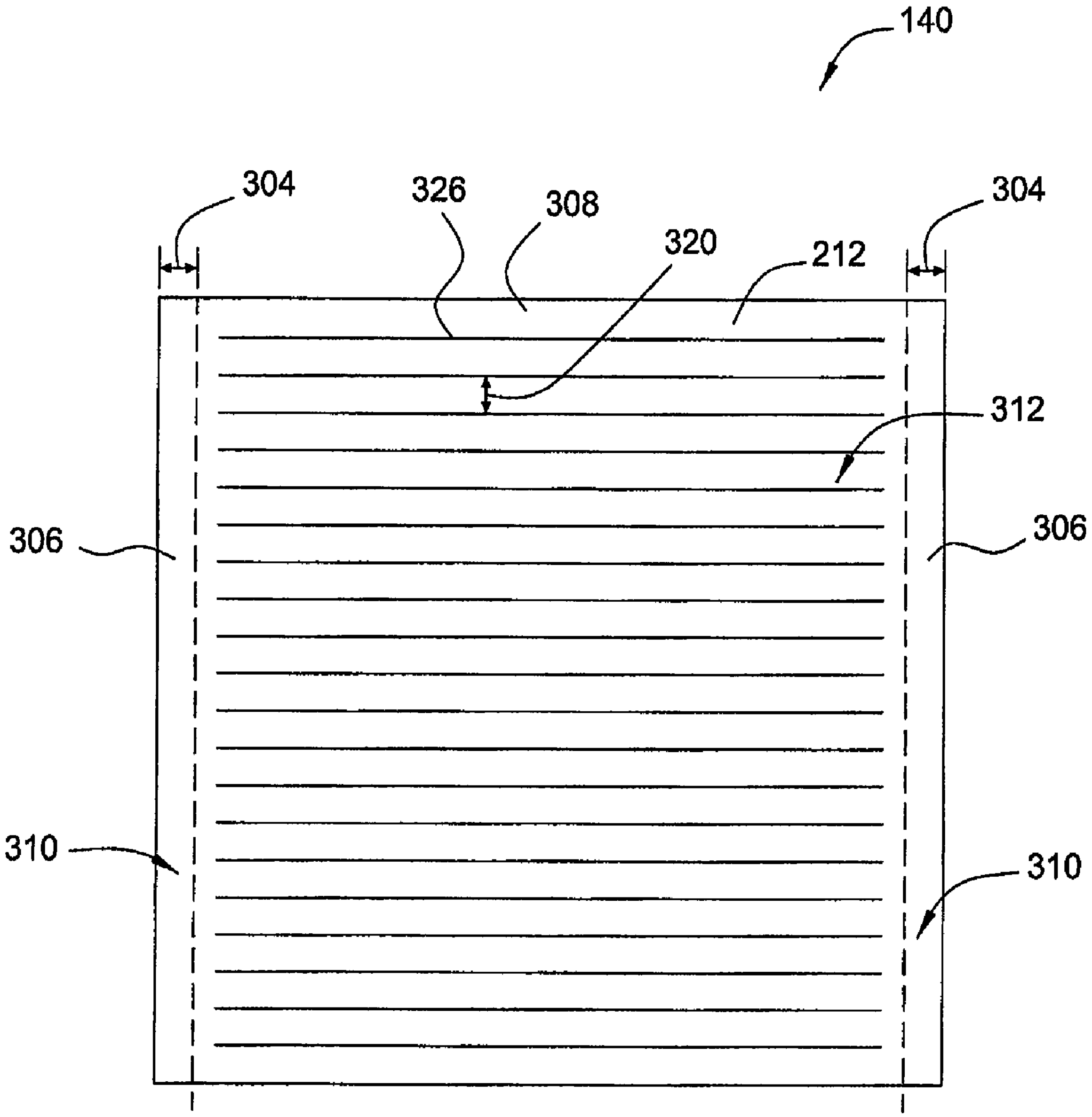
Figure 3C:
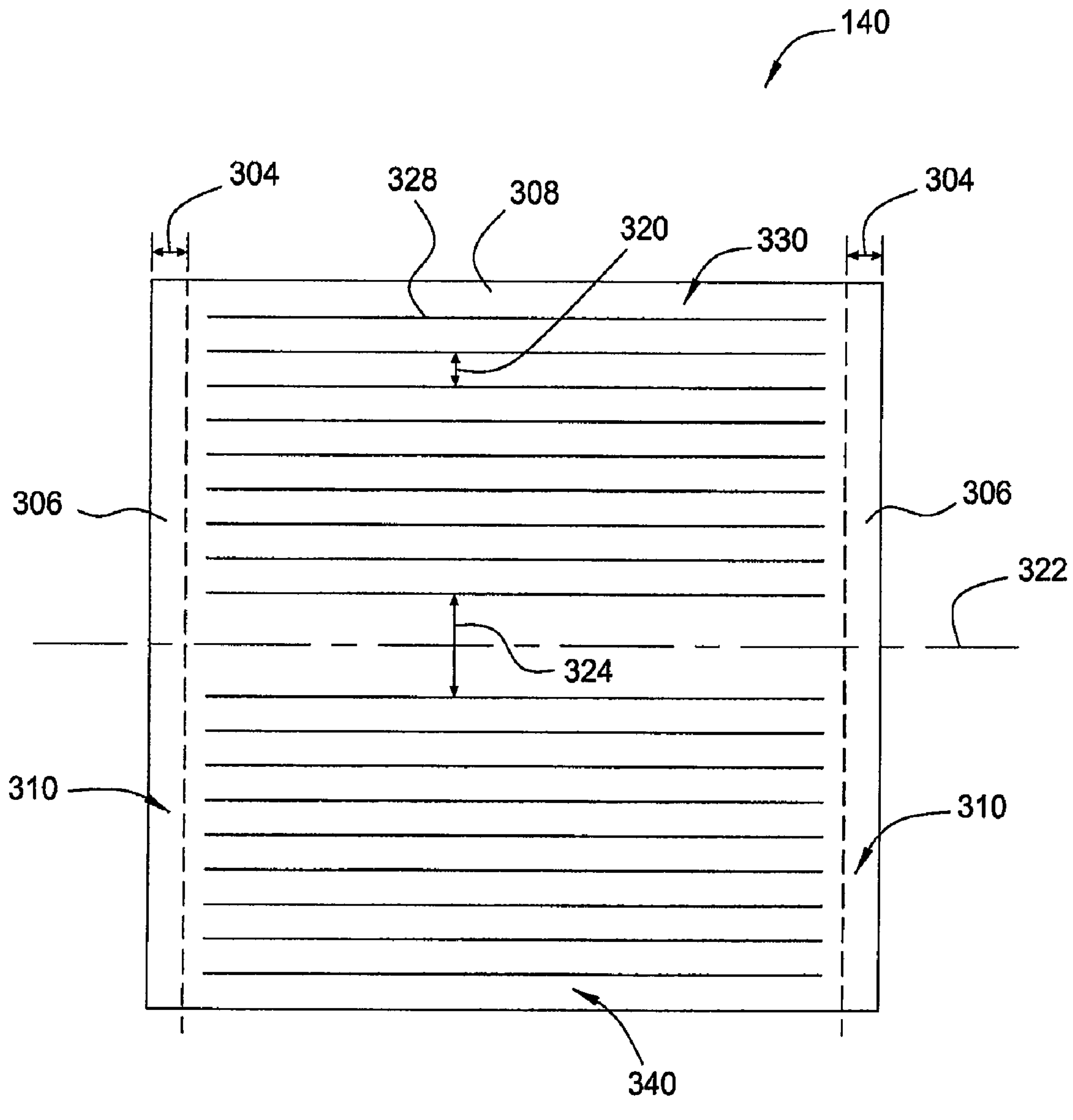

FIGS. 3A-C depict different embodiments of designed patterns of the TCO layer 212 disposed on the substrate 140 by laser scribing. Before the TCO layer 212 is transferred to the PECVD system 100 to deposit a silicon layer, the TCO layer 212 may be laser scribed to form a desired pattern on the TCO layer 212. The scribed pattern is generally selected to meet specific device requirements. As the charge may be accumulated on the TCO 212 layer during plasma processing, different pattern designs of the TCO layer may influence the charge distribution across the substrate surface significantly. Accordingly, a well-designed pattern of a laser scribed TCO layer may efficiently eliminate non-uniform charge buildup at undesired location across the substrate surface, thereby preventing arching at tip and/or edge of the substrate 140.

In the embodiment depicted in FIG. 3A, a scribing line 302 is formed in a square wave pattern on the center portion 308 of the TCO layer 212 on the substrate to form string-like solar cells. The scribing line 302 is offset a distance from the edge portions 306 of the substrate 140 so that the shadow frame 214 does not overlay the scribing line 302. The edge portions 306 of the substrate 140 may have a width 304 ranging between about 10 mm and about 30 mm, such as about 15 mm. The edge portion 306 is free of the scribing line 302 and enables the shadow frame 214 to be in complete contact with the conductive TCO surface, thereby preventing interruption and/or uniformity of the general path. The edge portion 306 of the TCO layer 212 separates the conductive TCO layer 212 into a peripheral region 310 and a cell-integrated region 312 where the solar cell devices are formed. The peripheral region 310, which will not have any devices formed thereon, provides a sufficient space for the shadow frame 214 to entirely and conductively holding on the substrate 140 disposed on the substrate support assembly 112, thereby establishing a good conductive ground path. The cell-integrated region 312 is, however, kept a distance away from the peripheral region 310, thereby eliminating the likelihood for unwanted discharging or arcing occurring on the cell-integrated region.

In the embodiment depicted in FIG. 3A, a scribing line 302 is formed in a square wave pattern on the center portion 308 of the TCO layer 212 on the substrate to form string-like solar cells. The scribing line 302 is offset a distance from the edge portions 306 of the substrate 140 so that the shadow frame 104 does not overlay the scribing line 302. The edge portions 306 of the substrate 140 may have a width 304 ranging between about 10 mm and about 30 mm, such as about 15 mm. The edge portion 306 is free of the scribing line 302 and enables the shadow frame 104 to be in complete contact with the conductive TCO surface, thereby preventing interruption and/or uniformity of the general path. The edge portion 306 of the TCO layer 212 separates the conductive TCO layer 212 into a peripheral region 310 and a cell-integrated region 312 where the solar cell devices are formed. The peripheral region 310, which will not have any devices formed thereon, provides a sufficient space for the shadow frame 104 to entirely and conductively holding on the substrate 140 disposed on the substrate support assembly 112, thereby establishing a good conductive ground path. The cell-integrated region 312 is, however, kept a distance away from the peripheral region 310, thereby eliminating the likelihood for unwanted discharging or arcing occurring on the cell-integrated region.

FIGS. 3B-3C depicts different embodiments of scribed patterns formed on the TCO layer 212. Similar to the square wave pattern of scribing lines 302 depicted in FIG. 3A, multiple parallel straight lines 326 may be formed on the TCO layer 212, as shown in FIG. 3B. Each straight line 326 is separated by a distance 320 from each other. The distance 320 may be between about 5 millimeter (mm) and about 15 millimeter (mm), such as about 10 millimeter (mm). Alternatively, as shown in FIG. 3C, the scribing lines 328 may be separated into an upper group 330 and a lower group 340. In one embodiment, the groups 330, 340 are separated by a distance that crosses a center line 322 of the substrate 140. The distance 324 may be between about 5 millimeter (mm) and about 45 millimeter (mm), for example, for example about 10 millimeter (mm) and about 40 millimeter (mm), such as about 30 millimeter (mm).

Figure 4:
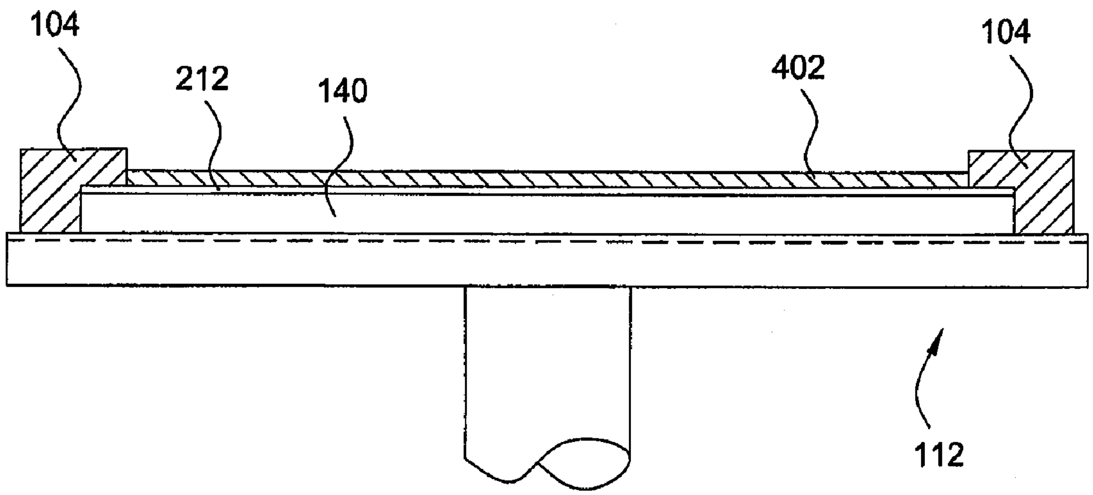
FIG. 4 depicts a cross sectional view of a substrate having a TCO layer disposed on a substrate support assembly.

FIG. 4 depicts a cross sectional view of a silicon layer 402 deposited on the TCO layer 212 disposed on the substrate 140 positioned on the substrate support assembly 112. The silicon layer 402 may be deposited on the substrate 140 using a suitable method. As the shadow frame 104 is in contact with and circumscribing the edge of the substrate 140, the silicon layer 402 is prevented from being depositing on the peripheral region 310 of the TCO layer 140, thereby proving a well ground contact surface during the silicon deposition process.

Thus, improved methods and apparatus for depositing a silicon layer on a transmitting conducting oxide (TCO) layer are provided. The method and apparatus advantageously increase grounding through the substrate support assembly while holding a TCO layer substrate during silicon deposition process, thereby preventing defect generation from TCO layer during silicon deposition process.

Thus, improved methods and apparatus for depositing a silicon layer on a transparent conducting oxide (TCO) layer are provided. The method and apparatus advantageously increase grounding through the substrate support assembly while holding a TCO layer substrate during silicon deposition process, thereby preventing defect generation from TCO layer during silicon deposition process.

What is claimed is:

1. A method for depositing a silicon layer on a transparent conducting oxide (TCO) layer, comprising:

laser scribing a cell-integrated region of the TCO layer disposed on a substrate for solar applications, the TCO layer having a periphery region that is free from laser scribing outward of the cell-integrated region, the periphery region having a width between about 10 mm and about 30 mm as measured from an edge of the substrate;

transferring the scribed substrate onto a support surface of a substrate support assembly disposed in a deposition chamber;

directly contacting a first conductive surface of a shadow frame to the periphery region of the scribed substrate;

directly contacting a second conductive surface of the shadow frame to the support surface; and depositing a silicon containing layer on the TCO layer in the deposition chamber.

2. The method of claim 1, wherein laser scribing further comprises:

forming a scribe line having parallel sections, the parallel sections being spaced apart by an amount that is between about 5 millimeter (mm) to about 45 millimeter (mm).

3. The method of claim 1, wherein transferring the scribed substrate into the deposition chamber further comprises:

positioning the substrate on the support surface of the substrate support assembly disposed in the deposition chamber, the support surface having a surface roughness between about 100 micro-inches and about 3000 micro-inches across the entire surface in contact with the substrate.

4. The method of claim 1, wherein the first and second conductive surfaces are bare aluminum.

5. The method of claim 1, wherein depositing the silicon containing layer further comprises:

depositing the silicon containing layer through an aperture of the shadow frame, wherein the aperture is smaller than a roughened surface formed of the support surface.

6. The method of claim 5 further comprising contacting the shadow frame to the support surface, wherein a portion of the shadow frame overlies a roughened portion of the support surface having a surface roughness between about 100 micro-inches and about 3000 micro-inches.

7. The method of claim 6, wherein contacting the shadow frame to the support surface further comprises:

contacting a portion of the support surface outward of the roughened surface.

8. A method for depositing a silicon layer on a transparent conducting oxide (TCO) layer, comprising:

providing a substrate having the TCO layer disposed thereon, wherein the TCO layer has a peripheral region and a cell integrated region, the cell integrated region having laser scribing patterns disposed thereon;

positioning the substrate on a substrate support assembly disposed in a processing chamber, wherein the substrate support assembly has a roughened surface in contact with the substrate;

directly contacting a shadow frame to the peripheral region of the TCO layer and to the substrate support assembly thereby creating an electrical ground path between the TCO layer and the substrate support assembly through the shadow frame; and depositing a silicon containing layer on the TCO layer through an aperture of the shadow frame.

9. The method of claim 8, wherein the peripheral region of the TCO layer on the substrate has a width between about 10 mm and about 30 mm as measured from an edge of the substrate.

10. The method of claim 8, wherein the roughened surface of the substrate support assembly has a roughness between about 100 μ-inches and 3000 μ-inches.

11. The method of claim 8, wherein positioning the substrate further comprises:

placing the entire backside of the substrate in contact with the roughened surface of the substrate support assembly, wherein the roughened surface has a roughness between about 100 μ-inches and 3000 μ-inches.

12. The method of claim 11, wherein contacting the shadow frame to the substrate support assembly further comprises:

contacting the shadow frame to the roughened surface.

13. The method of claim 11, wherein contacting the shadow frame to the substrate support assembly further comprises:

contacting a surface of the substrate support assembly outward of the roughened surface.

14. The method of claim 11, wherein contacting the shadow frame to the substrate support assembly further comprises:

positioning a portion of the shadow frame over the roughened surface.

15. The method of claim 8, wherein the aperture is smaller than the roughened surface formed in the substrate support surface.

16. The method of claim 8, wherein the peripheral region of the TCO layer on the substrate is free from laser scribing.

* * * * *

UNITED STATES PATENT AND TRADEMARK OFFICE

CERTIFICATE OF CORRECTION

PATENT NO. : 7,964,430 B2
APPLICATION NO. : 11/752823
DATED : June 21, 2011
INVENTOR(S) : Won et al.

It is certified that error appears in the above-identified patent and that said Letters Patent is hereby corrected as shown below:

<u>In the Title:</u>
Please delete "SILICON LAYER ON A LASER TRANSPARENT CONDUCTIVE OXIDE LAYER SUITABLE FOR USE IN SOLAR CELL APPLICATIONS" and insert --DEPOSITING A SILICON LAYER ON A LASER SCRIBED TRANSPARENT CONDUCTIVE OXIDE LAYER SUITABLE FOR USE IN SOLAR CELL APPLICATIONS-- therefor;

<u>In the Summary of the Invention:</u>
Columns 1, Lines 64-67 and Column 2, Lines 1-9, please delete
"providing a substrate having a TCO layer disposed thereon, wherein the TCO layer has a peripheral region and a cell integrated region, the cell integrated region having laser scribing patterns disposed thereon, positioning the substrate on a substrate support assembly disposed in a processing chamber, wherein the substrate support assembly has a roughened surface in contact with the substrate, contacting a shadow frame to the peripheral region of the TCO layer and to the substrate support assembly thereby creating an electrical ground path between the TCO layer and substrate support through the shadow frame, and depositing a silicon containing layer on the TCO layer through an aperture of the shadow frame."

and insert

--laser scribing a cell-integrated region of a TCO layer disposed on a substrate for solar applications, the TCO layer having a laser scribing free periphery region outward of the cell-integrated region, the periphery region having a width between about 10 mm and about 30 mm measured from an edge of the substrate, transferring the scribed substrate into a deposition chamber, and depositing a silicon containing layer on the TCO layer in the deposition chamber.-- therefor;

Column 2, Line 11, please delete "transmitting" and insert --transparent-- therefor;

<u>In the Detailed Description:</u>

Signed and Sealed this
Eighteenth Day of October, 2011

David J. Kappos
*Director of the United States Patent and Trademark Office*

Column 2, Line 59, please delete “transmitting” and insert --transparent-- therefor;

Column 3, Lines 3-14, please delete
“Embodiments of the present invention provide methods and apparatus for depositing a silicon layer on a transparent conducting oxide (TCO) layer suitable for solar cell applications, among others. In one embodiment, potential defects, such as blackish discoloring, haze, and arcing, may be reduced by releasing charges accumulated on the TCO surface by a well grounded depositing environment. Some embodiments for providing a well grounded depositing environment include an improved surface design pattern on the TCO layer, a roughened substrate support assembly and/or an improved shadow frame which is utilized to provide good electrical ground during silicon deposition.”

and insert

--Figure 1 is a schematic cross-sectional view of one embodiment of a plasma enhanced chemical vapor deposition (PECVD) system 100 in which the invention may be practiced. One suitable plasma enhanced chemical vapor deposition (PECVD) system is available from Applied Materials, Inc., Santa Clara, California. It is contemplated that other plasma processing chambers, including those from other manufactures, may be utilized to practice the present invention.-- therefor;

Column 4, Line 6, please delete “backing” and insert --first-- therefor;

Column 4, Lines 15-31, please delete

“The diffuser gravitational support 115 may supply a process gas to a gas block 117 mounted on the support 115. The gas block 117 is in communication with the diffuser 120 via a longitudinal bore 119 formed through the support 115, and supplies a process gas to the plurality of orifices 122 within the diffuser 120. In one embodiment, one or more process gasses travel through the gas block 117, and exit the longitudinal bore 119 through angled bores 119a into a large plenum 121 created between first plate 128 and diffuser 120, and a small plenum 123 within the diffuser 120. Subsequently, the one or more process gasses travel from the large plenum 121 and the small plenum 123 through the plurality of orifices 122 formed through the diffuser 120 and into the processing volume 180 below the diffuser 120. In operation, the substrate 140 is raised to the processing volume 180 and the plasma generated from a plasma source 124 excites gas or gases to deposit films on the substrate 140.”

and insert

--The plurality of orifices 122 may have different configurations to facilitate different gas flows in the processing volume 180. In one embodiment, the orifices 122 may flare to a diameter ranging between about 0.01 inch and about 1.0 inch, such as between about 0.01 inch and about 0.5 inch. The dimension and density of the flare openings of the orifices 122 may be varied across the surface of the diffuser 120. In one embodiment, dimension and densities of the orifices 122 located in the inner (*e.g.,* center) region of the diffuser 120 may be higher than the orifices 122 located in the outer (*e.g.,* edge) region. Examples of orifice configurations and a diffuser that may be used in the chamber 100 are described in commonly assigned U.S. Patent Publication No. 2005/0,251,990, filed July 12, 2004, by *Choi et al.,* United States Patent No. 6,722,827, filed August 8, 2001 by *Keller et al.*; United States Patent No. 6,477,980, issued November 12, 2002 to *White et al;* United States Patent Application Serial No. 11/173,210, filed July 1, 2005 by *Choi et al;* 10/337,483, filed January 7, 2003 by *Blonigan et al.;* Publication No. 2005/0,255,257, filed December 22, 2004 by *Choi et al.;* and Publication No. 2005/0,183,827, filed February 24, 2004 by *White et al.,* all of which are hereby incorporated by reference in their entireties.-- therefor;

Column 5, Line 11, please insert --defined by the upper side-- before 108;

Column 5, Line 11, please insert --of the conductive body 194.-- after 108;

Column 5, Lines 15-26, please delete

"The substrate support assembly 112 includes a conductive body 194 having the upper side 108 for supporting the substrate 140 thereon. The conductive body 194 may be made of a metal or metal alloy. In one embodiment, the conductive body 194 is made of aluminum. Lift pins 146 are moveably disposed through the substrate support assembly 112 and are adapted to space the substrate 140 from the substrate receiving surface defined by the upper side 108 of the conductive body 194. Alternatively, the outer surface of the conductive body 194 may be coated and/or anodized by a dielectric layer to prevent the substrate support assembly 112 from chemical attack during processing."

and insert

--In one embodiment, the upper side 108 of the substrate support assembly 112 upon which the substrate 140 rests during processing may be textured. The amount of contact between the substrate 140 and the substrate support assembly 112 may significantly influence the amount of charges trapped on the upper side 108 of the substrate support assembly 112. As the amount of charges trapped on the upper side 108 increases, the charges buildup on the substrate surface increase as well, thereby increasing the likelihood of arcing or abnormal discharging at the interface. Arcing or abnormal discharging may damage and contaminate the substrate surface and devices formed thereon. A roughened surface may improve the electrical contact of the two surfaces, *e.g.,* the upper side 108 of the substrate support assembly 112 and the substrate 140, by the higher contact stress at the sharp tips or high points of the roughened surface. The improved electrical contact of the two surfaces reduces the charge buildup at the interface and provides a good grounded surface, thereby reducing the potential of arcing or blackish coloring on the substrate surface. In one embodiment, an entire substrate support surface (e.g., the upper surface) of the substrate support assembly 112 is roughened so that the entire bottom surface of the substrate is in contact with the roughened surface. The roughened surface may have a roughness ranging from about 100 micro-inch (μ-inch) and about 3000 micro-inch (μ-inch).-- therefor;

Column 8, Line 66, please delete "214" and insert --104-- therefor;

Column 9, Line 3, please delete "214" and insert --104-- therefor;

Column 9, Line 10, please delete "214" and insert --104-- therefor;

Column 9, Lines 17-39, please delete

"In the embodiment depicted in Figure 3A, a scribing line 302 is formed in a square wave pattern on the center portion 308 of the TCO layer 212 on the substrate to form string-like solar cells. The scribing line 302 is offset a distance from the edge portions 306 of the substrate 140 so that the shadow frame 104 does not overlay the scribing line 302. The edge portions 306 of the substrate 140 may have a width 304 ranging between about 10 mm and about 30 mm, such as about 15 mm. The edge portion 306 is free of the scribing line 302 and enables the shadow frame 104 to be in complete contact with the conductive TCO surface, thereby preventing interruption and/or uniformity of the general path. The edge portion 306 of the TCO layer 212 separates the conductive TCO layer 212 into a peripheral region 310 and a cell-integrated region 312 where the solar cell devices are formed. The peripheral region 310, which will not have any devices formed thereon, provides a sufficient space for the shadow frame 104 to entirely and conductively holding on the substrate 140 disposed on the substrate support assembly 112, thereby establishing a good conductive ground path. The cell-integrated region 312 is, however, kept a distance away from the peripheral region 310, thereby eliminating the likelihood for unwanted discharging or arcing occurring on the cell-integrated region."

and insert

--In one embodiment, the scribing lines 302 each formed in the center portion 308 of the TCO layer 212 have a spacing 314 distanced away from each other. In an exemplary embodiment depicted in Figure 3A, the scribing lines 302 has a width between about 300 millimeter (mm) or greater and the spacing formed between each scribing lines 302 is between about 5 millimeter (mm) and about 45 millimeter (mm), for example about 5 millimeter (mm) and about 15 millimeter (mm), such as about 10 millimeter (mm).-- therefor;

Column 9, Line 66, please delete "transmitting" and insert --transparent-- therefor;

Column 10, Lines 5-11, please delete

"Thus, improved methods and apparatus for depositing a silicon layer on a transparent conducting oxide (TCO) layer are provided. The method and apparatus advantageously increase grounding through the substrate support assembly while holding a TCO layer substrate during silicon deposition process, thereby preventing defect generation from TCO layer during silicon deposition process."

and insert

--While the foregoing is directed to embodiments of the present invention, other and further embodiments of the invention may be devised without departing from the basic scope thereof, and the scope thereof is determined by the claims that follow.-- therefor.

UNITED STATES PATENT AND TRADEMARK OFFICE

CERTIFICATE OF CORRECTION

PATENT NO. : 7,964,430 B2
APPLICATION NO. : 11/752823
DATED : June 21, 2011
INVENTOR(S) : Won et al.

It is certified that error appears in the above-identified patent and that said Letters Patent is hereby corrected as shown below:

Title Page, Item (54) and at Column 1, lines 1-4,

In the Title:
Please delete "SILICON LAYER ON A LASER TRANSPARENT CONDUCTIVE OXIDE LAYER SUITABLE FOR USE IN SOLAR CELL APPLICATIONS" and insert --DEPOSITING A SILICON LAYER ON A LASER SCRIBED TRANSPARENT CONDUCTIVE OXIDE LAYER SUITABLE FOR USE IN SOLAR CELL APPLICATIONS-- therefor;

In the Summary of the Invention:
Columns 1, Lines 64-67 and Column 2, Lines 1-9, please delete
"providing a substrate having a TCO layer disposed thereon, wherein the TCO layer has a peripheral region and a cell integrated region, the cell integrated region having laser scribing patterns disposed thereon, positioning the substrate on a substrate support assembly disposed in a processing chamber, wherein the substrate support assembly has a roughened surface in contact with the substrate, contacting a shadow frame to the peripheral region of the TCO layer and to the substrate support assembly thereby creating an electrical ground path between the TCO layer and substrate support through the shadow frame, and depositing a silicon containing layer on the TCO layer through an aperture of the shadow frame."

and insert

--laser scribing a cell-integrated region of a TCO layer disposed on a substrate for solar applications, the TCO layer having a laser scribing free periphery region outward of the cell-integrated region, the periphery region having a width between about 10 mm and about 30 mm measured from an edge of the substrate, transferring the scribed substrate into a deposition chamber, and depositing a silicon containing layer on the TCO layer in the deposition chamber.-- therefor;

This certificate supersedes the Certificate of Correction issued October 18, 2011.

Signed and Sealed this
Twenty-second Day of November, 2011

David J. Kappos
*Director of the United States Patent and Trademark Office*

Column 2, Line 11, please delete "transmitting" and insert --transparent-- therefor;

In the Detailed Description:

Column 2, Line 59, please delete "transmitting" and insert --transparent-- therefor;

Column 3, Lines 3-14, please delete
"Embodiments of the present invention provide methods and apparatus for depositing a silicon layer on a transparent conducting oxide (TCO) layer suitable for solar cell applications, among others. In one embodiment, potential defects, such as blackish discoloring, haze, and arcing, may be reduced by releasing charges accumulated on the TCO surface by a well grounded depositing environment. Some embodiments for providing a well grounded depositing environment include an improved surface design pattern on the TCO layer, a roughened substrate support assembly and/or an improved shadow frame which is utilized to provide good electrical ground during silicon deposition."

and insert

--Figure 1 is a schematic cross-sectional view of one embodiment of a plasma enhanced chemical vapor deposition (PECVD) system 100 in which the invention may be practiced. One suitable plasma enhanced chemical vapor deposition (PECVD) system is available from Applied Materials, Inc., Santa Clara, California. It is contemplated that other plasma processing chambers, including those from other manufactures, may be utilized to practice the present invention.-- therefor;

Column 4, Line 6, please delete "backing" and insert --first-- therefor;

Column 4, Lines 15-31, please delete
"The diffuser gravitational support 115 may supply a process gas to a gas block 117 mounted on the support 115. The gas block 117 is in communication with the diffuser 120 via a longitudinal bore 119 formed through the support 115, and supplies a process gas to the plurality of orifices 122 within the diffuser 120. In one embodiment, one or more process gasses travel through the gas block 117, and exit the longitudinal bore 119 through angled bores 119a into a large plenum 121 created between first plate 128 and diffuser 120, and a small plenum 123 within the diffuser 120. Subsequently, the one or more process gasses travel from the large plenum 121 and the small plenum 123 through the plurality of orifices 122 formed through the diffuser 120 and into the processing volume 180 below the diffuser 120. In operation, the substrate 140 is raised to the processing volume 180 and the plasma generated from a plasma source 124 excites gas or gases to deposit films on the substrate 140."

and insert

--The plurality of orifices 122 may have different configurations to facilitate different gas flows in the processing volume 180. In one embodiment, the orifices 122 may flare to a diameter ranging between about 0.01 inch and about 1.0 inch, such as between about 0.01 inch and about 0.5 inch. The dimension and density of the flare openings of the orifices 122 may be varied across the surface of the diffuser 120. In one embodiment, dimension and densities of the orifices 122 located in the inner (*e.g.*, center) region of the diffuser 120 may be higher than the orifices 122 located in the outer (*e.g.*, edge)

region. Examples of orifice configurations and a diffuser that may be used in the chamber 100 are described in commonly assigned U.S. Patent Publication No. 2005/0,251,990, filed July 12, 2004, by *Choi et al.*, United States Patent No. 6,722,827, filed August 8, 2001 by *Keller et al.*; United States Patent No. 6,477,980, issued November 12, 2002 to *White et al*; United States Patent Application Serial No. 11/173,210, filed July 1, 2005 by *Choi et al*; 10/337,483, filed January 7, 2003 by *Blonigan et al.*; Publication No. 2005/0,255,257, filed December 22, 2004 by *Choi et al.*; and Publication No. 2005/0,183,827, filed February 24, 2004 by *White et al.*, all of which are hereby incorporated by reference in their entireties.-- therefor;

Column 5, Line 11, please insert --defined by the upper side-- before 108;

Column 5, Line 11, please insert --of the conductive body 194.-- after 108;

Column 5, Lines 15-26, please delete

"The substrate support assembly 112 includes a conductive body 194 having the upper side 108 for supporting the substrate 140 thereon. The conductive body 194 may be made of a metal or metal alloy. In one embodiment, the conductive body 194 is made of aluminum. Lift pins 146 are moveably disposed through the substrate support assembly 112 and are adapted to space the substrate 140 from the substrate receiving surface defined by the upper side 108 of the conductive body 194. Alternatively, the outer surface of the conductive body 194 may be coated and/or anodized by a dielectric layer to prevent the substrate support assembly 112 from chemical attack during processing."

and insert

--In one embodiment, the upper side 108 of the substrate support assembly 112 upon which the substrate 140 rests during processing may be textured. The amount of contact between the substrate 140 and the substrate support assembly 112 may significantly influence the amount of charges trapped on the upper side 108 of the substrate support assembly 112. As the amount of charges trapped on the upper side 108 increases, the charges buildup on the substrate surface increase as well, thereby increasing the likelihood of arcing or abnormal discharging at the interface. Arcing or abnormal discharging may damage and contaminate the substrate surface and devices formed thereon. A roughened surface may improve the electrical contact of the two surfaces, *e.g.*, the upper side 108 of the substrate support assembly 112 and the substrate 140, by the higher contact stress at the sharp tips or high points of the roughened surface. The improved electrical contact of the two surfaces reduces the charge buildup at the interface and provides a good grounded surface, thereby reducing the potential of arcing or blackish coloring on the substrate surface. In one embodiment, an entire substrate support surface (e.g., the upper surface) of the substrate support assembly 112 is roughened so that the entire bottom surface of the substrate is in contact with the roughened surface. The roughened surface may have a roughness ranging from about 100 micro-inch (μ-inch) and about 3000 micro-inch (μ-inch).-- therefor;

Column 8, Line 66, please delete "214" and insert --104-- therefor;

Column 9, Line 3, please delete “214” and insert --104-- therefor;

Column 9, Line 10, please delete “214” and insert --104-- therefor;

Column 9, Lines 17-39, please delete

“In the embodiment depicted in Figure 3A, a scribing line 302 is formed in a square wave pattern on the center portion 308 of the TCO layer 212 on the substrate to form string-like solar cells. The scribing line 302 is offset a distance from the edge portions 306 of the substrate 140 so that the shadow frame 104 does not overlay the scribing line 302. The edge portions 306 of the substrate 140 may have a width 304 ranging between about 10 mm and about 30 mm, such as about 15 mm. The edge portion 306 is free of the scribing line 302 and enables the shadow frame 104 to be in complete contact with the conductive TCO surface, thereby preventing interruption and/or uniformity of the general path. The edge portion 306 of the TCO layer 212 separates the conductive TCO layer 212 into a peripheral region 310 and a cell-integrated region 312 where the solar cell devices are formed. The peripheral region 310, which will not have any devices formed thereon, provides a sufficient space for the shadow frame 104 to entirely and conductively holding on the substrate 140 disposed on the substrate support assembly 112, thereby establishing a good conductive ground path. The cell-integrated region 312 is, however, kept a distance away from the peripheral region 310, thereby eliminating the likelihood for unwanted discharging or arcing occurring on the cell-integrated region.”

and insert

--In one embodiment, the scribing lines 302 each formed in the center portion 308 of the TCO layer 212 have a spacing 314 distanced away from each other. In an exemplary embodiment depicted in Figure 3A, the scribing lines 302 has a width between about 300 millimeter (mm) or greater and the spacing formed between each scribing lines 302 is between about 5 millimeter (mm) and about 45 millimeter (mm), for example about 5 millimeter (mm) and about 15 millimeter (mm), such as about 10 millimeter (mm).-- therefor;

Column 9, Line 66, please delete “transmitting” and insert --transparent-- therefor;

Column 10, Lines 5-11, please delete

“Thus, improved methods and apparatus for depositing a silicon layer on a transparent conducting oxide (TCO) layer are provided. The method and apparatus advantageously increase grounding through the substrate support assembly while holding a TCO layer substrate during silicon deposition process, thereby preventing defect generation from TCO layer during silicon deposition process.”

and insert

--While the foregoing is directed to embodiments of the present invention, other and further embodiments of the invention may be devised without departing from the basic scope thereof, and the scope thereof is determined by the claims that follow.-- therefor.